United States Patent
Tabrizi et al.

(10) Patent No.: US 6,647,665 B1
(45) Date of Patent: Nov. 18, 2003

(54) DOOR SYSTEMS FOR LOW CONTAMINATION, HIGH THROUGHPUT HANDLING OF WORKPIECES FOR VACUUM PROCESSING

(75) Inventors: Farzad Tabrizi, Danville, CA (US); Barry Kitazumi, Milpitas, CA (US); David A. Barker, Walnut Creek, CA (US); David A. Setton, Alameda, CA (US); Leszek Niewmierzycki, San Jose, CA (US); Michael J. Kuhlman, Fremont, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/651,453

(22) Filed: Aug. 30, 2000

Related U.S. Application Data

(62) Division of application No. 09/200,660, filed on Nov. 25, 1998, now Pat. No. 6,315,512.
(60) Provisional application No. 60/067,299, filed on Nov. 28, 1997.

(51) Int. Cl.[7] ............................................... E05F 11/24
(52) U.S. Cl. ...................................................... 49/340
(58) Field of Search ............................ 49/41, 209, 210, 49/216, 217, 218, 219, 256, 257, 246, 254, 340

(56) References Cited

U.S. PATENT DOCUMENTS

| | | | | |
|---|---|---|---|---|
| 2,213,601 | A | * | 9/1940 | White |
| 3,116,664 | A | * | 1/1964 | Hereth et al. |
| 3,312,017 | A | * | 4/1967 | Witherspoon et al. |
| 3,758,919 | A | * | 9/1973 | Dilworth, Jr. ............. 49/246 X |

(List continued on next page.)

FOREIGN PATENT DOCUMENTS

| JP | 63-143833 | 6/1988 | ................. 414/940 |
|---|---|---|---|

OTHER PUBLICATIONS

D. Aitken et al., A New VLSI Compatible Rapid Thermal Processing System, Elsevier Science Publishers B.V., 0168–583X/87.

R. Sheets, Automatic Cassette to Cassette Radiant Impulse Processor, Nuclear Instruments and Methods in Physics Research B6 (1985) 219–223, North–Holland, Amsterdam.

*Primary Examiner*—Daniel P. Stodola
(74) *Attorney, Agent, or Firm*—Wilson Sonsini Goodrich & Rosati

(57) ABSTRACT

A workpiece handling system with dual load locks, a transport chamber and a process chamber. Workpieces may be retrieved from one load lock for processing at vacuum pressure, while workpieces are unloaded from the other load lock at the pressure of the surrounding environment. The transport chamber has a transport robot with two arms. Processed workpieces and new workpieces may be exchanged by a simple under/over motion of the two robot arms. The transport robot rotates about a central shaft to align with the load locks or the process chamber. The robot may also be raised or lowered to align the arms with the desired location to which workpieces are deposited or from which workpieces are retrieved. The two load locks may be positioned one above the other such that a simple vertical motion of the robot can be used to select between the two load locks. The two load locks and transport robot allow almost continuous processing. Additional process chambers may be added to the transport chamber to further increase throughput. Each stage of the workpiece handling system may also be designed to handle multiple workpieces, such as two side by side workpieces. Throughput is increased while allowing shared machinery to be used. Linear and rotational doors may be used for the load locks to provide a simple, compact design.

18 Claims, 16 Drawing Sheets

U.S. PATENT DOCUMENTS

| | | | |
|---|---|---|---|
| 3,918,204 A | * 11/1975 | Lynch et al. | 49/254 X |
| 4,334,633 A | * 6/1982 | Piegza | 49/340 X |
| 4,507,078 A | 3/1985 | Tam et al. | 432/11 |
| 4,649,261 A | 3/1987 | Sheets | 219/390 |
| 4,698,486 A | 10/1987 | Sheets | 250/492.2 |
| 4,794,217 A | 12/1988 | Quan et al. | 437/247 |
| 4,818,327 A | 4/1989 | Davis et al. | 156/345 |
| 4,936,227 A | * 6/1990 | Baker et al. | 105/378 |
| 5,001,327 A | 3/1991 | Hirasawa et al. | 219/390 |
| 5,043,300 A | 8/1991 | Nulman | 437/200 |
| 5,083,896 A | * 1/1992 | Uehara et al. | 414/744.5 |
| 5,096,364 A | * 3/1992 | Messer et al. | 414/744.5 |
| 5,248,636 A | * 9/1993 | Davis et al. | 437/225 |
| 5,430,271 A | 7/1995 | Orgami et al. | 219/388 |
| 5,444,217 A | 8/1995 | Moore et al. | 219/405 |
| 5,486,080 A | * 1/1996 | Sieradzki | 414/217 |
| 5,564,889 A | 10/1996 | Araki | 414/935 X |
| 5,588,258 A | * 12/1996 | Wright et al. | 49/340 |
| 5,636,963 A | 6/1997 | Haraguchi et al. | 414/217 X |
| 5,647,724 A | 7/1997 | Davis et al. | 414/937 X |
| 5,695,564 A | 12/1997 | Imahashi | 118/719 |
| 5,789,878 A | 8/1998 | Kroeker et al. | 414/935 X |
| 5,794,277 A | 8/1998 | Jones | 4/236 |
| 5,837,059 A | 11/1998 | Glants | 414/217 X |
| 5,838,121 A | 11/1998 | Fairbairn et al. | 801/14 X |
| 5,855,726 A | 1/1999 | Soraoka et al. | 414/939 X |
| 5,884,433 A | 3/1999 | Watanabe et al. | 49/360 |
| 5,934,856 A | 8/1999 | Asakawa et al. | 414/217 |
| 5,997,235 A | 12/1999 | Hofmeister | 414/217 |
| 6,036,582 A | * 3/2000 | Aizawa et al. | 451/41 |
| 6,178,361 B1 | * 1/2001 | George et al. | 700/213 |

* cited by examiner

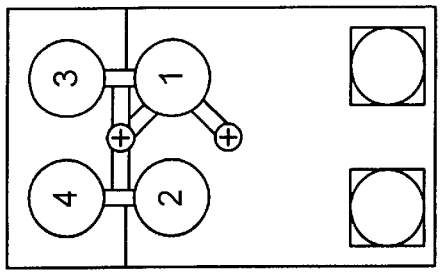
Figure 1-(2) (Prior Art)
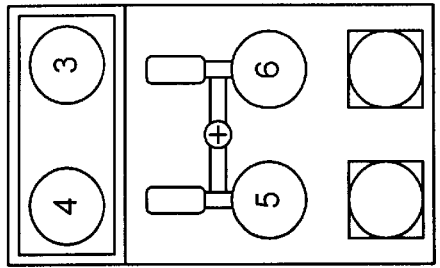
Figure 1-(6) (Prior Art)
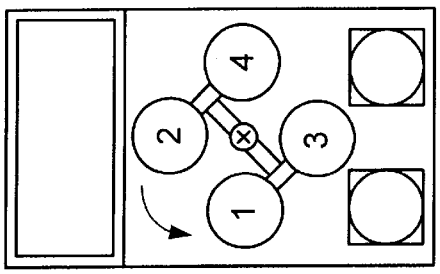
Figure 1-(3) (Prior Art)
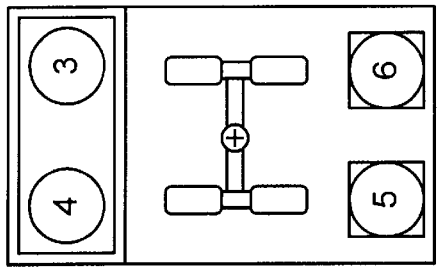
Figure 1-(7) (Prior Art)
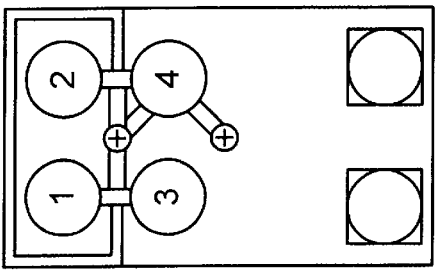
Figure 1-(4) (Prior Art)
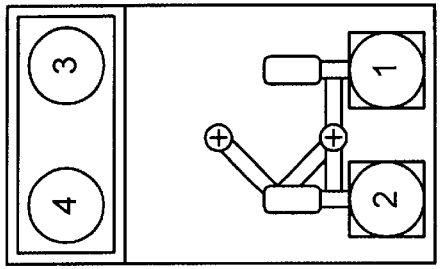
Figure 1-(8) (Prior Art)
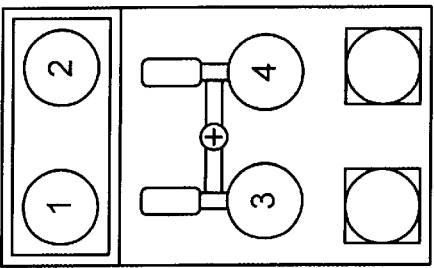
Figure 1-(1) (Prior Art)
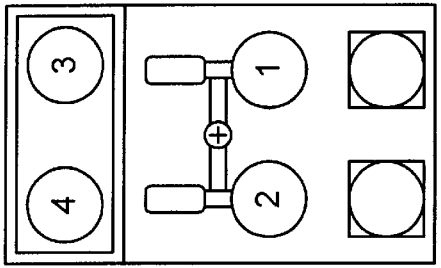
Figure 1-(5) (Prior Art)

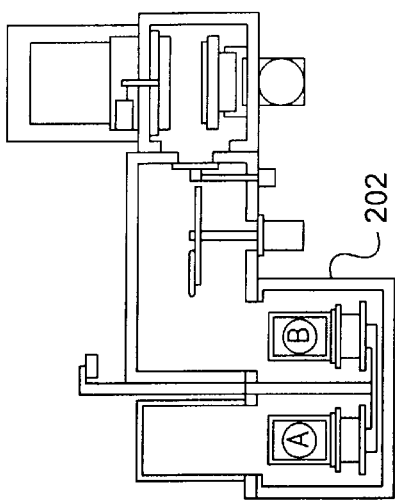
(Prior Art)
Figure 2-(3)
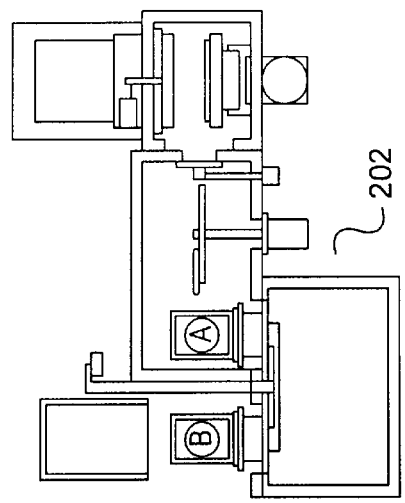
(Prior Art)
Figure 2-(6)
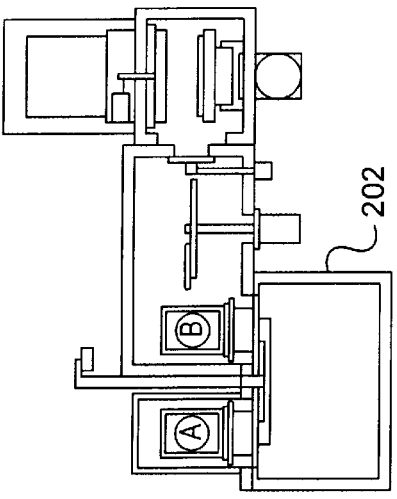
(Prior Art)
Figure 2-(2)
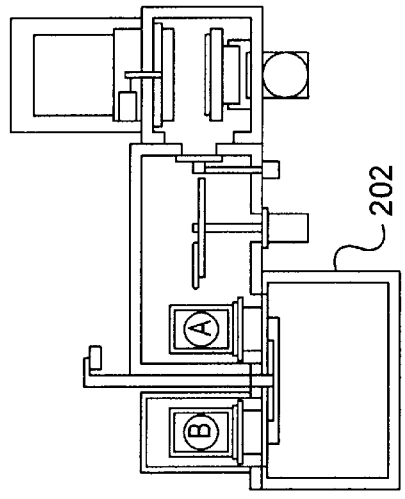
(Prior Art)
Figure 2-(5)
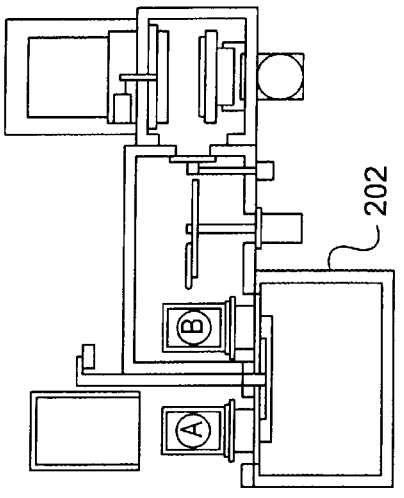
(Prior Art)
Figure 2-(1)
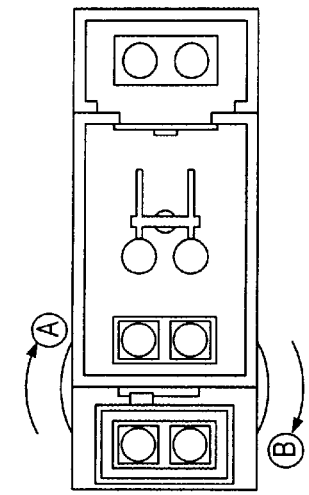
(Prior Art)
Figure 2-(4)

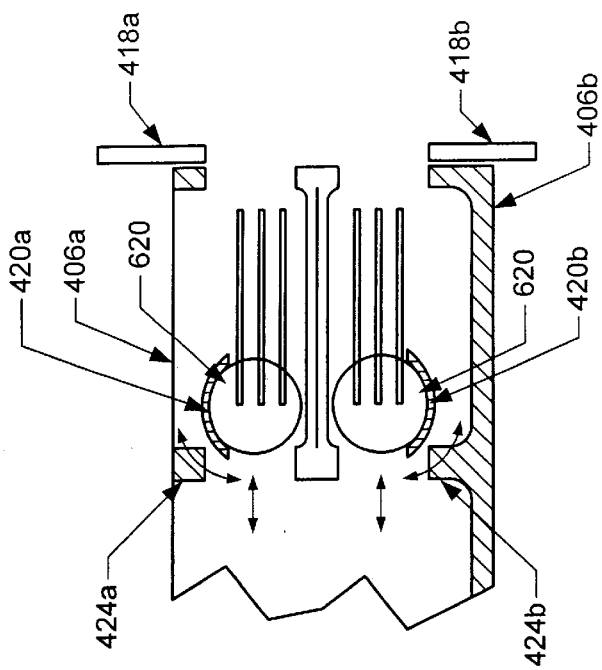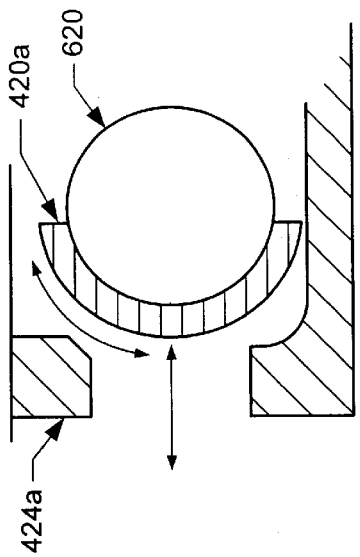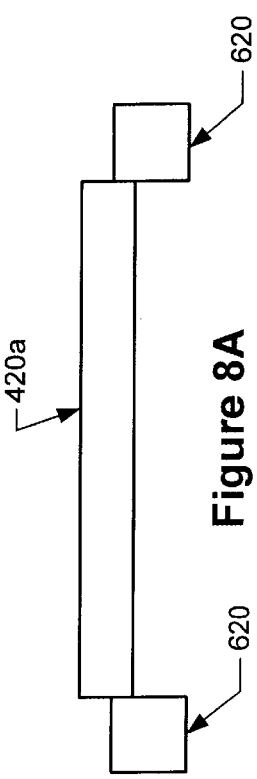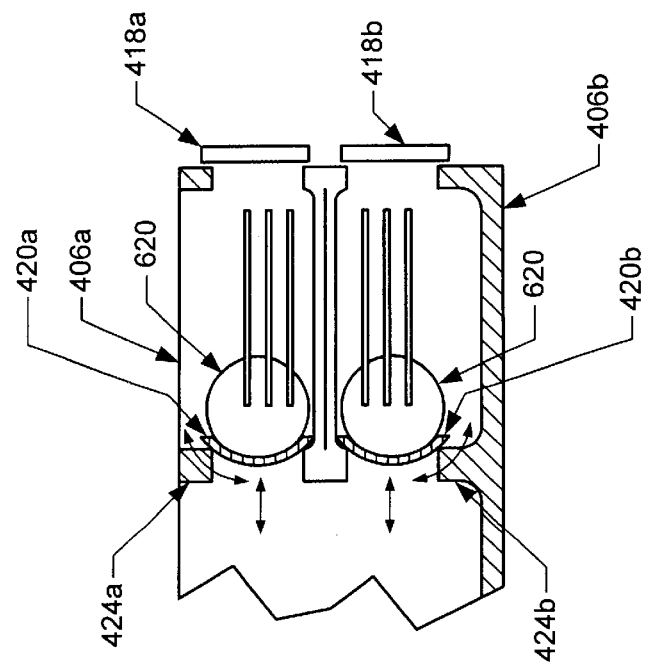

DOOR SYSTEMS FOR LOW CONTAMINATION, HIGH THROUGHPUT HANDLING OF WORKPIECES FOR VACUUM PROCESSING

REFERENCE TO RELATED APPLICATION

The present application is a divisional of U.S. application Ser. No. 09/200,660 filed Nov. 25, 1998, which issued as U.S. Pat. No. 6,315,512, which claims priority from U.S. provisional application No. 60/067,299 filed Nov. 28, 1997. Provisional application No. 60/067,299 is hereby incorporated herein by reference in its entirety.

FIELD OF THE INVENTION

The field of the present invention relates in general to vacuum processing of workpieces. More particularly, the field of the invention relates to systems and methods for low contamination, high throughput handling of workpieces including processing at a pressure different from atmospheric. Examples of such workpieces might include semiconductor wafers or flat panels for displays for which vacuum processing is usually required.

BACKGROUND OF THE INVENTION

The increased cost for semiconductor manufacturing equipment and factory floor space has driven equipment vendors increasingly to compete on the productivity of their products and thus to have to increase the number of workpieces, such as wafers, that can be processed in any piece of such equipment per hour (throughput). There are three central factors that determine workpiece throughput: the time spent actually processing the workpieces (e.g. removing photoresist, implanting ions, etc.), the number of workpieces that can be simultaneously processed, and the amount of time that elapses between removing processed workpieces from a processing chamber and inserting unprocessed workpieces into the chamber.

In some conventional workpiece processing systems, there may be a significant delay between the time when processed workpieces are removed from a process chamber and the time when the new unprocessed workpieces are provided to the process chamber. For instance, some systems use a single robot arm to remove and insert workpieces. The robot arm must first align with the processed workpiece, remove the processed workpiece from the processing chamber, move to align with a storage area for processed workpieces (which may involve a 180 degree rotation), deposit the processed workpiece, move to align with a storage area containing unprocessed workpieces, retrieve an unprocessed workpiece, move to align with the processing chamber (which may involve a 180 degree rotation) and deposit the unprocessed workpiece in the processing chamber. The cumulative time required for all such steps may be large resulting in a substantial delay between the time when a processed workpiece is removed from the processing chamber and the time when a new unprocessed workpiece is provided to the processing chamber. In addition, each time that a batch containing a given number of workpieces is processed, these workpieces must be removed through a load lock to transit the pressure differential between atmosphere and process pressure and a new batch must be loaded into the processing environment. The time required for removing and loading batches and for pressurizing or evacuating the load lock also decreases throughput.

One system that has been designed to overcome some of the disadvantages of conventional systems is the currently available Aspen™ system available from Mattson Technology, Inc. which is used to process semiconductor workpieces. In the current Aspen™ system, a workpiece handling robot has two pairs of workpiece support paddles facing in opposite directions as shown in FIG. 1. Two new workpieces are loaded on the paddles on one side of the robot. Then two processed workpieces are removed from the process chamber on the paddles on the opposite side of the robot. The robot rotates once and then deposits the new workpieces in the process chamber and puts the processed workpieces back in the cassette which may hold from 13 to as many as 26 workpieces. Once a cassette of workpieces is processed, the cassette is removed and a new cassette is provided through the load lock mechanism shown in FIG. 2. As shown in FIG. 2, a rotation mechanism is used to exchange cassettes quickly in an outer load lock indicated at 202.

Another system designed to overcome some of the disadvantages of conventional systems is shown in FIGS. 3A and 3B and is described in U.S. Pat. No. 5,486,080. In this system two separate robots 62 and 64 move independently of one another to transport workpieces between an implantation station 25 and load locks 22a and 22b. An intermediate transfer station 50 is used to transfer the workpieces. FIG. 3B is a workpiece path diagram showing the transport steps used to move workpieces in the system. While a first robot transports an unprocessed workpiece from the transfer station 50 to the implantation station 25, a second robot transports a processed workpiece from the implantation station 25 to one of the load locks 22a or 22b. While one load lock is being used for processing, the other load lock can be pressurized, reloaded and evacuated.

While the above systems improve throughput and decrease down time for pressurizing and evacuating load locks, reductions in system size, complexity, and cost while maintaining or improving throughput are still needed. For instance, the system of FIGS. 3A and 3B uses two separate robots and a transfer station all of which take up space. However, it is desirable to decrease the size of workpiece processing systems to the extent possible, because the clean room area used for the system is very expensive to maintain. In addition, separate drive mechanisms which may be used for the two robots would be expected to be more complicated and expensive than a system that employs only one drive mechanism.

In addition to throughput, size, complexity and cost, a fundamental constraint on workpiece handling systems is the necessity to avoid contaminating workpieces. Very small amounts of contaminants, such as dirt or dust can render a workpiece unusable and the size and number tolerance for particulate contaminants continues to decrease as workpiece geometries decrease. Workpiece processing equipment may introduce contaminants in a variety of ways. For example, particles may be shed when two pieces of machinery rub or touch. It is important to minimize the exposure of the workpieces to such contaminants during handling and processing.

It is a particular challenge to design doors that minimize particles generated by friction. Doors open and close to allow workpieces to pass between the ambient (usually a clean room environment) to a sealed (and possibly evacuated) chamber or between two chambers. Opening and closing the doors may involve mechanical mechanisms that create particles or may generate particles when two surfaces are pushed together to close the door. It is desirable to decrease the number of particles generated by such doors to reduce the likelihood of contaminating workpieces. In addition to avoiding contamination, it is desirable in many instances to use a door that does not occupy much space, thereby reducing the overall size of the system and conserving valuable clean room space.

In summary, there is a need for a workpiece handling system with high throughput but that does not entail relatively complicated or expensive mechanisms, or mechanisms that occupy a relatively large amount of space. There is a further need for a workpiece processing system with reduced particle generation and workpiece contamination. Without limiting the foregoing, there is a need for door assemblies for use in such systems which reduce the potential for contamination and occupy a relatively small space. Preferably a workpiece handling and processing system would satisfy all of the foregoing needs.

SUMMARY OF THE INVENTION

Aspects of the present invention provide a workpiece processing system including multiple load locks, a workpiece transfer chamber and one or more process chamber(s). In these aspects of the invention, the core of the system consists of the aforementioned multiple load lock stations, which may be stacked vertically and act as buffers between a workpiece handler at atmospheric pressure and another workpiece handler at another pressure typically closer to the pressure at which the processes are done. In another embodiment each load lock may function independently from the other(s). Hence, one may be open to atmosphere where a handler unloads or reloads workpieces while other(s) operate, for example, in partial vacuum, allowing a vacuum handler to supply workpieces to and from the process chamber(s). Additionally, the load locks may provide the capability to cool post process workpieces prior to or during their pressure transition from the reduced pressure of the load lock to atmospheric pressure. This functional independence makes such a system capable of providing a steady supply of pre-processed workpieces for the vacuum handler thus achieving high throughput in nearly continuous workpiece processing.

In another embodiment, a controlled mini-environment can be created on the atmospheric side of the load locks to provide a clean, particle free volume for loading or unloading workpieces. Air filtration systems and/or laminar flow hoods can be incorporated for the purpose of contamination control. Multiple workpiece-holder docking stations can be mounted to the enclosure, creating a supply of pre-processed workpieces to the system.

In another embodiment, a robotics handler can operate in the mini-environment and bring workpieces from their holders (which may be called cassettes) to the load locks and back again. This handler can utilize any combination of compound or individual rotational, vertical, and horizontal movements to selectively align with the workpiece cassettes or load locks for the purpose of transferring workpieces. The robot handler can have two sets of paddles, or other devices intended for retaining the workpieces during said transport. One set may consist of multiple, vertically stacked paddles, while the other may be a single paddle situated below the others. Each set is capable of independent or dependent linear motion such that any combination of the two can be used to transport workpieces to and from the load locks. Additional components can be mounted to the robot, or be made accessible in the mini-environment. These stations could provide operations such as workpiece identification or any other pre- or post-process inspection.

In another embodiment, a linear door mechanism may be used to seal one doorway of each load lock. An extractable door plate contained in a housing may be extended against the doorway for sealing or retracted for unsealing. The door plate and housing may then be raised or lowered to provide access for workpieces to pass through the doorway. If load locks are positioned above one another, the door of the upper load lock might raise when opened and, conversely, the lower door might drop to provide a pathway for workpiece transfer.

In another embodiment, dual or multiple load locks can be stacked vertically to minimize the system footprint. Each load lock may contain shelves adjacent to which workpieces can be placed and staged. These shelves may be situated such that workpieces are contained next to and on top of one another. Workpiece temperature could be controlled through thermal contact with the shelves which may be heated or cooled by gaseous conduction and radiation. Gases might also be directed over the workpieces, prior to or after processing, to achieve desired temperatures.

In another embodiment, a rotational door may be used to seal the other doorway of each load lock. This door may be extended against the doorway for sealing or retracted for unsealing. Once decoupled from the doorway, the door may rotate up or down to allow workpieces to pass through. The door of the upper load lock may rotate upward when opened and the lower load lock door may rotate downward. The compactness of the door's operation allows for vertically stacked load locks occupying minimal space.

In one embodiment a robot handler residing in a central transfer chamber, with pressure closer to process chamber pressure than atmospheric pressure may be utilized to transport workpieces from the load locks to the process chamber (s) and back to the load locks after processing. Such duties may be shared by two robotic arms utilizing common compound or individual vertical and rotational movements, but acting independently when extending or retracting to pick or place workpieces. Additionally, two or possibly more workpieces may be located side by side on paddles or other devices fixed to each robot arm. Furthermore, the robots may operate in an over/under fashion to reduce their geometrical profile and minimize the transfer time of post- and pre-processed workpieces. The robot arm structure can be made to avoid any bearing surfaces passing directly over a workpiece and thus helping ensure cleaner, lowerparticle-on workpiece contamination during operation.

In another embodiment, a slit door could be used to isolate the process chamber environment from that of the transfer chamber. Such a door could work utilizing vertical motions to allow passage of workpieces through the process chamber doorway. Small horizontal motion could be used to seal or unseal the door from the doorway. Both motions allow for a very compact door and contribute to minimizing the footprint of the system. Such a door could be made to seal off positive pressure in the process chamber while the transfer chamber operated at negative pressure. In another embodiment, a process chamber could be serviced at atmospheric pressure while the transfer chamber remained at partial or near-vacuum.

In another embodiment, the transfer chamber could be designed to dock three or more process chambers, each capable of processing two or more workpieces side by side. Each process chamber could be designed as a modular entity, requiring a minimum amount of effort to mount to and communicate with the main transfer chamber and its elements. Additionally, multiple process chambers mounted to the transfer chamber might each provide the same or different process capability.

In another embodiment, pre- or post-process stations could be located in the transfer chamber and made accessible to the vacuum robot handler. Examples of such processes include, but are not limited to, preheating or cooling of workpieces and workpiece orientation and alignment.

BRIEF DESCRIPTION OF THE DRAWINGS

These and other features and advantages of the present invention will become more apparent to those skilled in the art from the following detailed description in conjunction with the appended drawings in which:

FIGS. 1-(1) through 1-(8) illustrates the workpiece transport path of a prior art workpiece handling system.

FIGS. 2-(1) through 2-(6) illustrates a load lock transfer system of a prior art workpiece handling system.

FIG. 8A is a top plan view of a rotational door according to an exemplary embodiment of the present invention.

FIG. 8B is a simplified side view of load locks having rotational doors in a closed position according to an exemplary embodiment of the present invention.

FIG. 8C is a simplified side view of load locks having rotational doors in an open position according to an exemplary embodiment of the present invention.

FIG. 8D is a simplified side view illustrating the rotational and linear motions used to open and close rotational doors according to an exemplary embodiment of the present invention.

DESCRIPTION

The following description is presented to enable any person skilled in the art to make and use the invention. Descriptions of specific designs are provided as examples. Various modifications to the embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 3A:
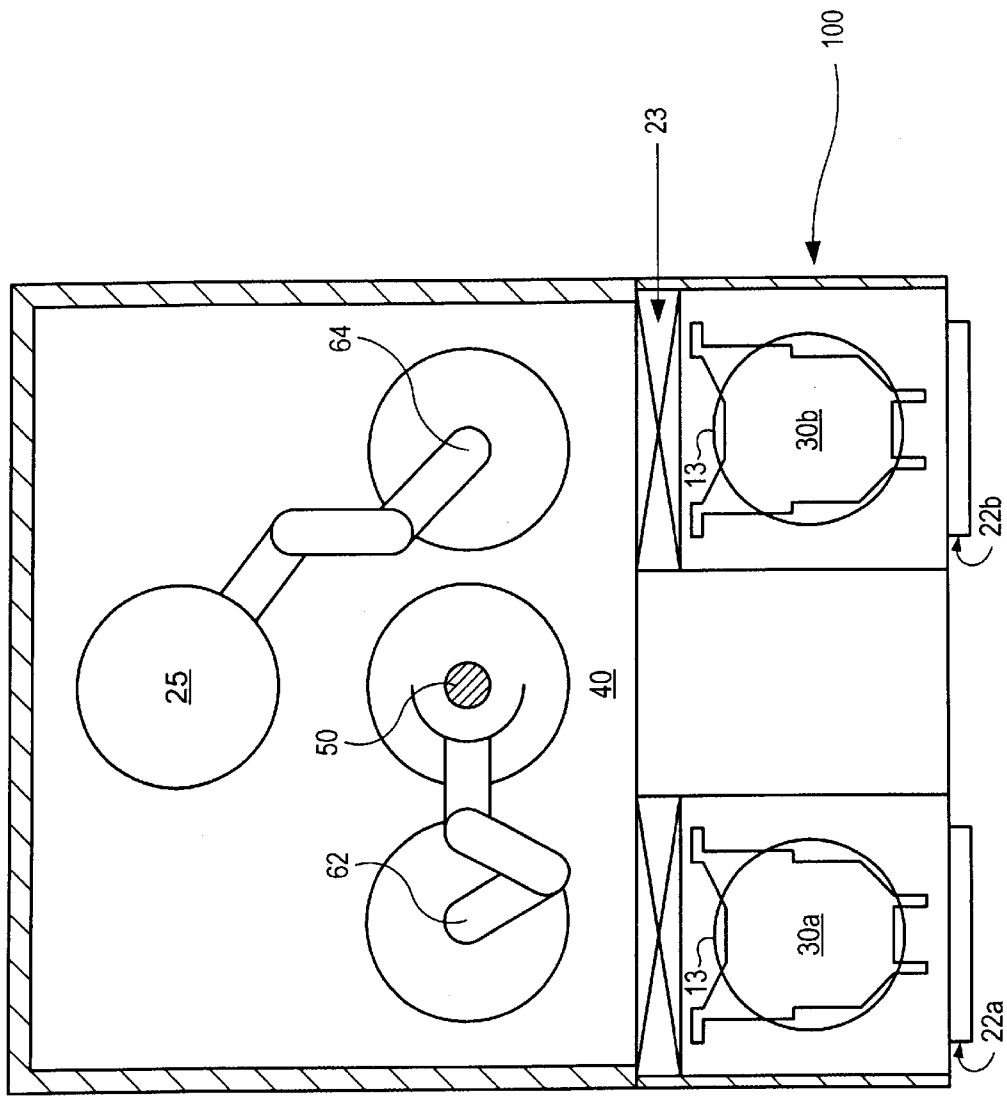
FIG. 3A illustrates a prior art workpiece handling system with two robots.
Figure 3B:
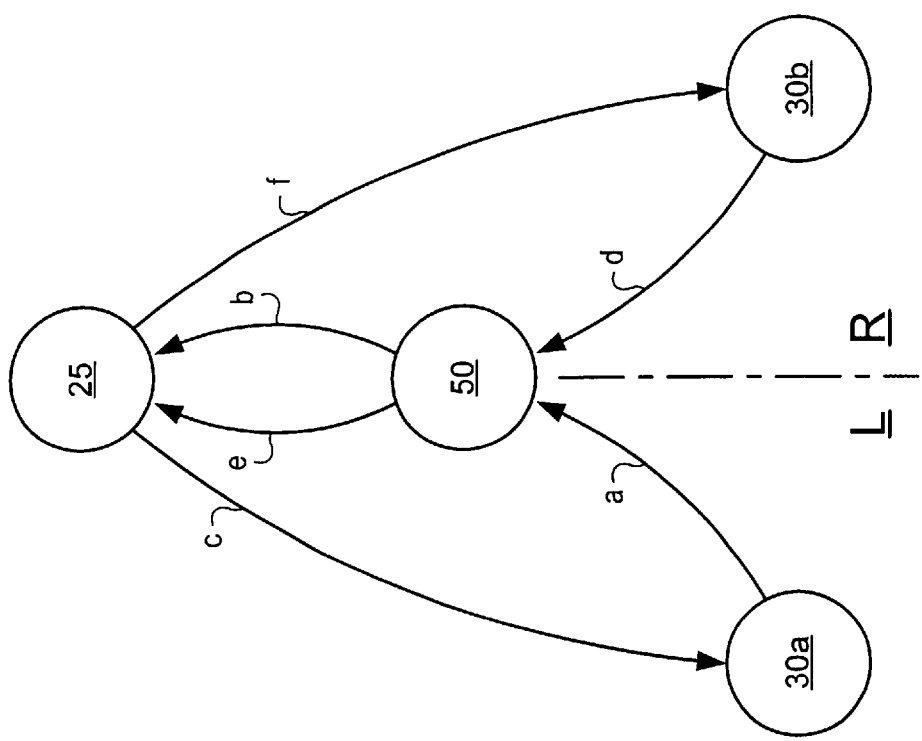
FIG. 3B illustrates the workpiece transport path in the prior art system of FIG. 3A.
Figure 4:
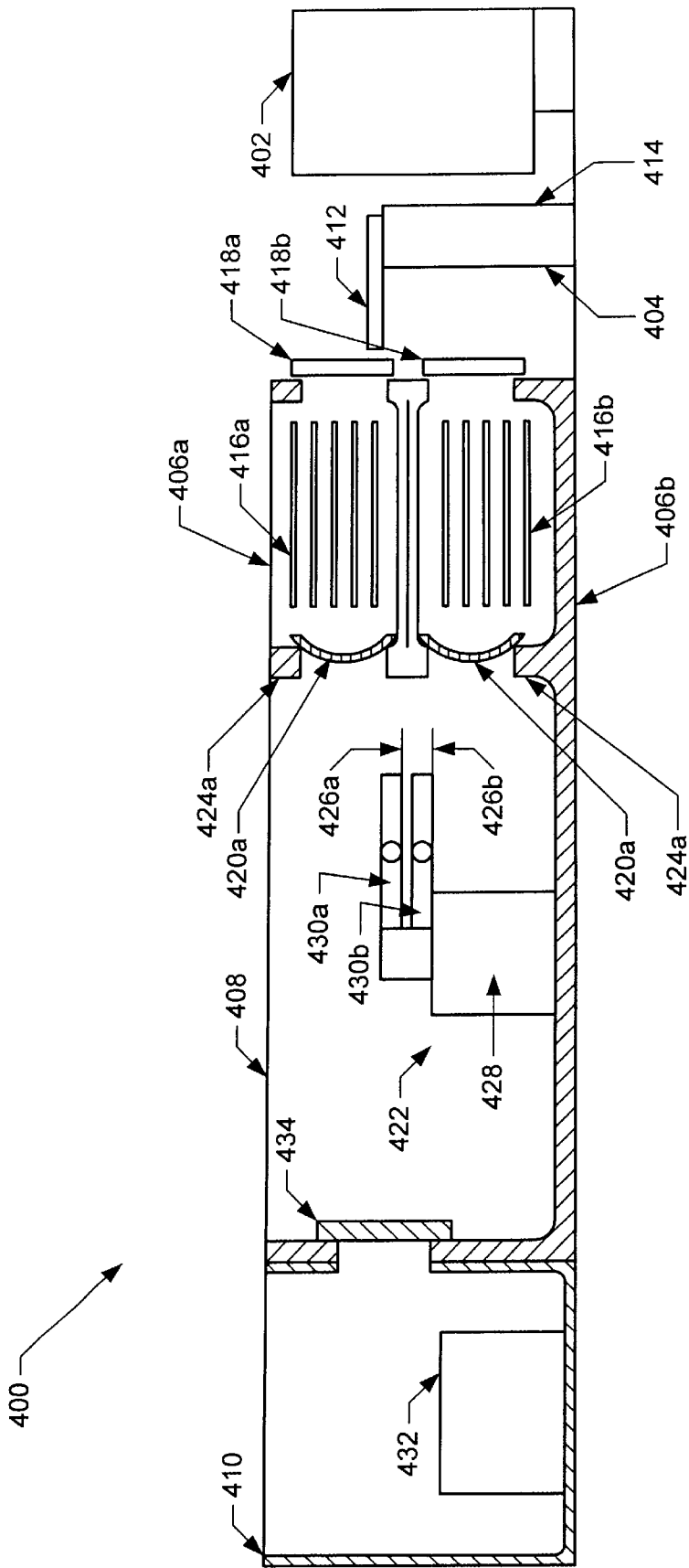
FIG. 4 is a simplified side cross-sectional view of a workpiece handling system according to an exemplary embodiment of the present invention.

FIG. 4 is a simplified side cross-sectional view of a semiconductor workpiece handling system, generally indicated at 400, according to an embodiment of the present invention. As shown in FIG. 4, system 400 includes a workpiece cassette holder 402 which may be in a clean room environment, an atmospheric robot 404, an upper load lock 406a, a lower load lock 406b, a vacuum transport chamber 408 and a process chamber 410. System 400 allows workpieces to be transported from cassette holder 402 to process chamber 410 for processing using a compact and simplified load lock and robotics design with high throughput and a low potential for contamination. Cassettes of workpieces to be processed are initially provided at cassette holder 402. Atmospheric robot 404 includes one or more paddle(s) 412 for supporting and transporting workpieces and a shaft 414 for rotating and/or raising or lowering paddle(s) 412. When the robot retrieves workpieces from a cassette, the shaft is rotated and positioned so paddle(s) 412 faces the cassette. Paddle(s) 412 extends horizontally to retrieve one or more workpieces and then retracts with the workpieces on paddle (s) 412. Shaft 414 then rotates and moves so paddle(s) 412 face load locks 406a and 406b. The shaft is raised or lowered to align the paddle with shelves in either load lock 406a or 406b in the course of which all motions due to independent control may occur simultaneously or in sequence. Generally, at any given time one of the load locks will be open to atmospheric robot 404, while workpieces in the other load lock are being processed at vacuum pressures. Paddle(s) 412 then may extend horizontally to deposit the workpiece(s) in the appropriate load lock. Atmospheric robot 404 also removes workpiece(s) from the load locks and deposits the processed workpiece(s) in a cassette in a similar manner.

The load locks contain one or more shelves 416a and 416b to hold workpieces. The shelves may be cooled to provide a cooling station for workpieces after processing. In alternate embodiments, a cassette-like holder may be loaded into the load lock rather than providing a shelf or shelves in the load lock. The load locks are sealed on the outside by linear doors 418a and 418b. The top linear door 418a may be raised to expose an opening through which workpieces may be loaded into, or unloaded from, upper load lock 406a. The bottom linear door 418b may be lowered to expose a similar opening through which workpieces may be loaded into, or unloaded from, lower load lock 406b.

After atmospheric robot 404 removes processed workpieces from a load lock and reloads it with new workpieces, the linear door is closed and the load lock is evacuated to vacuum pressure to match the pressure of the vacuum transport chamber 408. A rotational door 420a or 420b is then opened to allow a vacuum transport robot 422 to access the workpieces. An upper rotational drive (not shown) moves upper rotational door 420a linearly a slight distance away from the inner wall 424a of the upper load lock and rotates it. The rotational drive raises or lowers the door to expose an opening through which workpieces may be retrieved from shelves 416a before processing and returned after processing. A lower rotational drive (not shown) moves lower rotational door 420b in a similar manner back and upward or downward from wall 424b to allow access to workpieces in lower load lock 406b.

The dual load lock system shown in FIG. 4 allows almost continuous processing without significant down time for providing new workpieces from the atmospheric clean room to the vacuum processing environment. When workpieces are being loaded into one of the load locks (for example upper load lock 406a), the other load lock 406b is at vacuum pressure. For the upper load lock 406a, linear door 418a would be open and atmospheric robot 404 would remove processed workpieces and reload the load lock with new workpieces. Rotational door 420a would be closed to provide a seal against the vacuum pressure of vacuum transport chamber 408. At the same time, rotational door 420b would be open and linear door 418b would be closed to allow workpieces in lower load lock 406b to be accessed for processing.

After loading, linear door 418a is closed and upper load lock 406a is evacuated by a vacuum pump (not shown). When the appropriate pressure is obtained, rotational door 420a may be opened. In order to allow near continuous processing, upper load lock 406a may be evacuated and rotational door 420a may be opened before or just as the penultimate processed workpiece is returned to lower load lock 406b. A new workpiece from upper load lock 406a is then exchanged with the last processed workpiece in process chamber 410 which is returned to lower load lock 406b. The rotational door 420b is then closed and the pressure in lower load lock 406b is raised to equilibrium with the surrounding environment (which may be a clean room at atmospheric pressure). Linear door 418b is then opened and atmospheric robot 404 removes processed workpieces and reloads new workpieces in lower load lock 406b. The process then continues such that new workpieces are always or nearly always available from one of the load locks for processing in the vacuum environment.

The vacuum transport robot 422 retrieves new workpieces from whichever load lock is open and places the workpieces in process chamber 410 for processing. The vacuum transport robot 422 also removes processed workpieces from process chamber 410 and returns them to the respective load lock. Vacuum transport robot 422 is designed to minimize the transport time required to remove a processed workpiece from, and reload a new workpiece into, the process chamber 410. The transport time is down time for process chamber 410 which reduces throughput, so it is important to keep the transport time short.

The transport robot has one or more upper paddle(s) 426a and lower paddle(s) 426b for supporting and transporting workpieces and a shaft 428 for rotating and/or raising or lowering the paddles. The robot has upper arms 430a and lower arms 430b affixed to a four-bar linkage for extending and retracting paddles 426a and 426b, respectively. For purposes of the following discussion, it will be assumed that rotational door 420a is open and that new workpieces are available in upper load lock 406a, although it is understood that a similar process is used when workpieces are available in lower load lock 406b. Initially, it is assumed that the last workpiece from lower load lock 406b is being processed in process chamber 410 and that the second to last processed workpiece was just returned to lower load lock 406b. At this time, both upper and lower rotational doors 420a and 420b are open and upper load lock 406a contains new workpieces to be processed. Shaft 428 is then raised to align one of the paddles (for example upper paddle 426a) with a new workpiece on a shelf in upper load lock 406a. Arm 430a then extends and paddle 426a retrieves a new workpiece from the upper load lock. The arm 430a then retracts and shaft 428 rotates 180 degrees so the arms and paddles face the process chamber. Both arms are fully retracted when the shaft rotates. This minimizes the rotation diameter and allows a relatively compact transport chamber to be used. This is particularly desirable when 300 millimeter or larger workpieces are being handled. After rotation, the shaft is raised or lowered as necessary to align paddle 426b with the processed workpiece in process chamber 410. Of course, in some embodiments, this alignment may occur prior to or during rotation. The processed workpiece may remain at or near a process station 432 for removal or, in some process chambers, the workpiece may be raised on pins or other mechanisms for removal. A door 434 may be opened to allow the processed workpiece to be removed and a new workpiece to be placed in the process chamber. The door may be a linear or rotational door as described above or may be a conventional door system. The door 434 may be opened as the transport robot 422 rotates and aligns, so there is no extra delay (or the robot may be fully rotated and aligned prior to completion of processing, in which case the door is opened at the completion of processing).

Arm 430b then extends and paddle 426b retrieves the processed workpiece.

Arm 430b then retracts and shaft 428 is lowered to align paddle 426a with the desired position for depositing a new workpiece in the process chamber. Arm 430a extends and a new workpiece is deposited in process chamber 410 from paddle 426a. Arm 430a then retracts. The shaft then rotates 180 degrees with both arms in the retracted position.

Shaft 428 is then lowered or raised to align with the respective shelf in lower load lock 406b. Arm 430b extends and returns the last processed workpiece to lower load lock 406b. Arm 430b retracts and rotational door 420b is closed. The pressure in lower load lock 406b is then raised so the processed workpieces can be removed as described above. Shaft 428 then raises paddle 426a to align with a new workpiece in upper load lock 406a. Arm 430a extends, picks up and retracts with a new workpiece. Transport robot 422 rotates and the empty lower paddle 426b is aligned to retrieve the processed workpiece from process chamber 410. When processing is complete, door 434 opens and arm 430b extends and retracts with the processed workpiece. The new workpiece is then deposited in the process chamber as described above. The robot rotates again and arm 430b extends and retracts to deposit the processed workpiece on the applicable shelf of upper load lock 406a. Arm 430a extends and retracts to obtain a new workpiece and the process continues until the last workpiece from upper load lock 406a is in process chamber 410. By that time, lower load lock 406b has been unloaded and reloaded with new unprocessed workpieces and then pumped down, after which lower rotational door 420b is opened.

Figure 5:
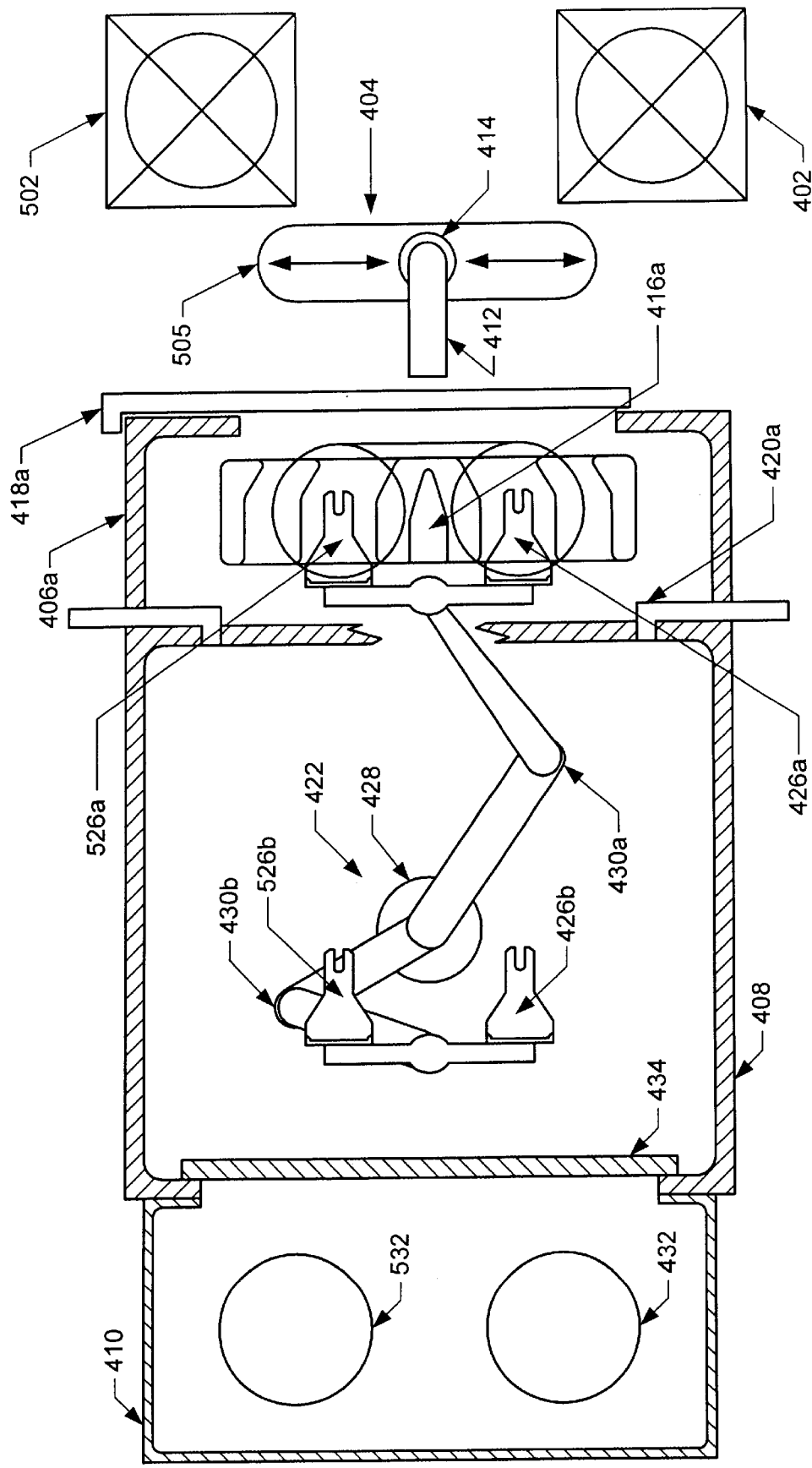
FIG. 5 is a simplified top cross-sectional view of a workpiece handling system according to an exemplary embodiment of the present invention.

FIG. 5 is a top cross-sectional view of a workpiece handling system according to an embodiment of the present invention which allows for dual side-by-side workpiece processing. The robots, load locks and process chamber are all designed to handle two (or possibly more) workpieces at a time. As a result, a significant amount of the machinery and control mechanisms are shared while throughput is doubled (or more). As shown in FIG. 5, two or more workpiece cassette holders 402 and 502 may be provided side-by-side. Atmospheric robot 404 may be positioned on a track 505 which allows the robot to move horizontally to align with either cassette holder 402 or 502. Upper load lock 406a and lower load lock 406b (not shown in FIG. 5) each have side by side positions for workpieces on each of the shelves 416a or 416b (not shown in FIG. 5). Transport robot 422 has dual paddles on each arm 430a and 430b. Upper arm 430a supports paddles 426a and 526a. Lower arm 430b supports paddles 426b and 526b. The robot is thereby capable of depositing or retrieving two workpieces at a time from shelves 416a or 416b. For instance, arm 430b may extend to deposit two processed workpieces in a respective load lock. Shaft 428 may then be raised or lowered to align paddles 426a and 526a with new workpieces on a different shelf. Arm 430a may then extend to retrieve the two new workpieces for processing. Once both of the arms are retracted, shaft 428 may rotate, so the paddles face the process chamber 410. The process chamber is designed to contain at least two process stations 432 and 532. Door 434 is raised and arm 430b extends to retrieve the two processed workpieces from the process chamber 410. After arm 430b retracts with the processed workpieces, the shaft is raised or lowered to align the new workpieces with the desired position in the process chamber. Arm 430a then extends to deposit the new workpieces for processing. The process continues as described above with two workpieces processed at a time.

Figure 6A:
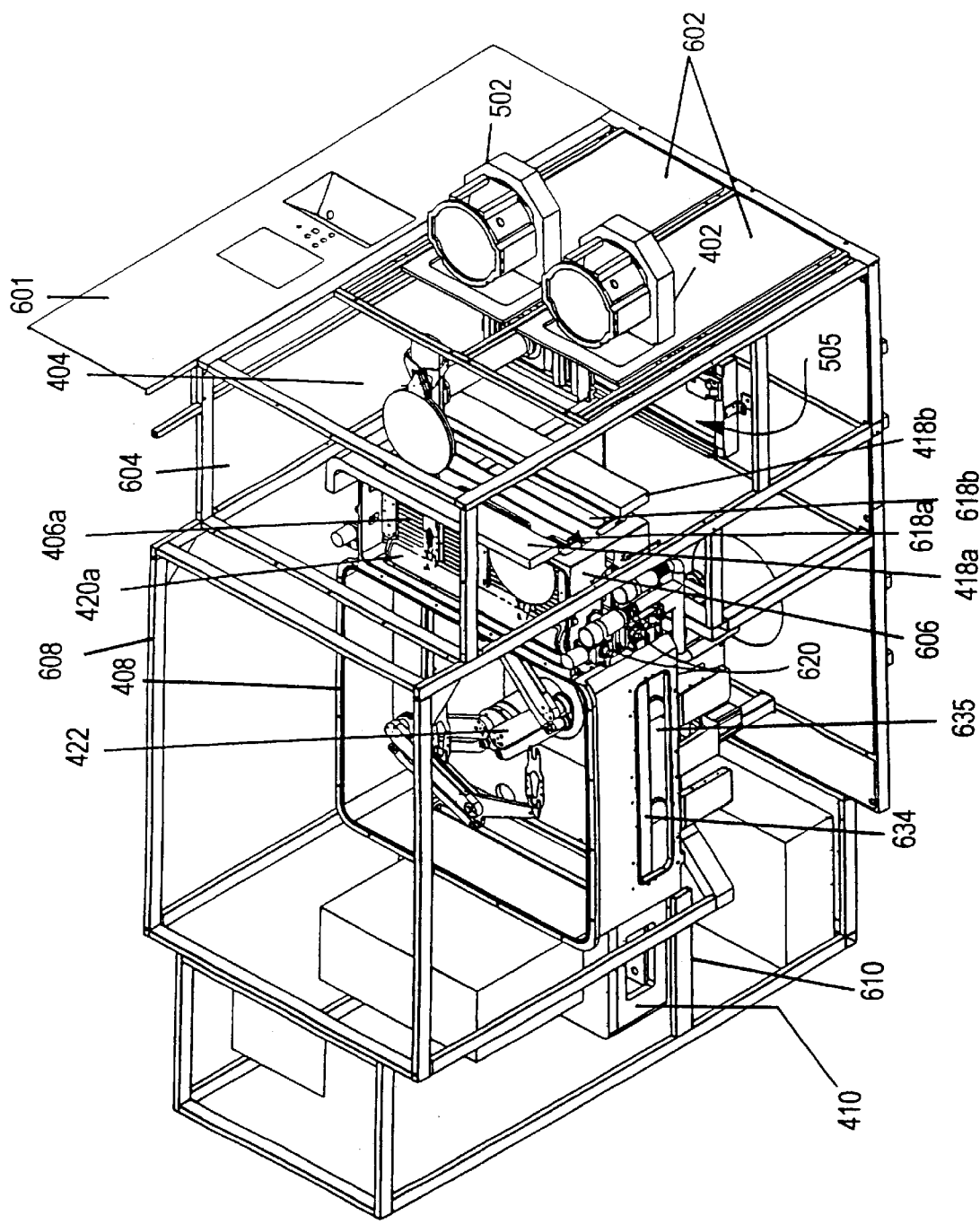
FIG. 6A is a top, front perspective view of a workpiece handling system according to an exemplary embodiment of the present invention.
Figure 6B:
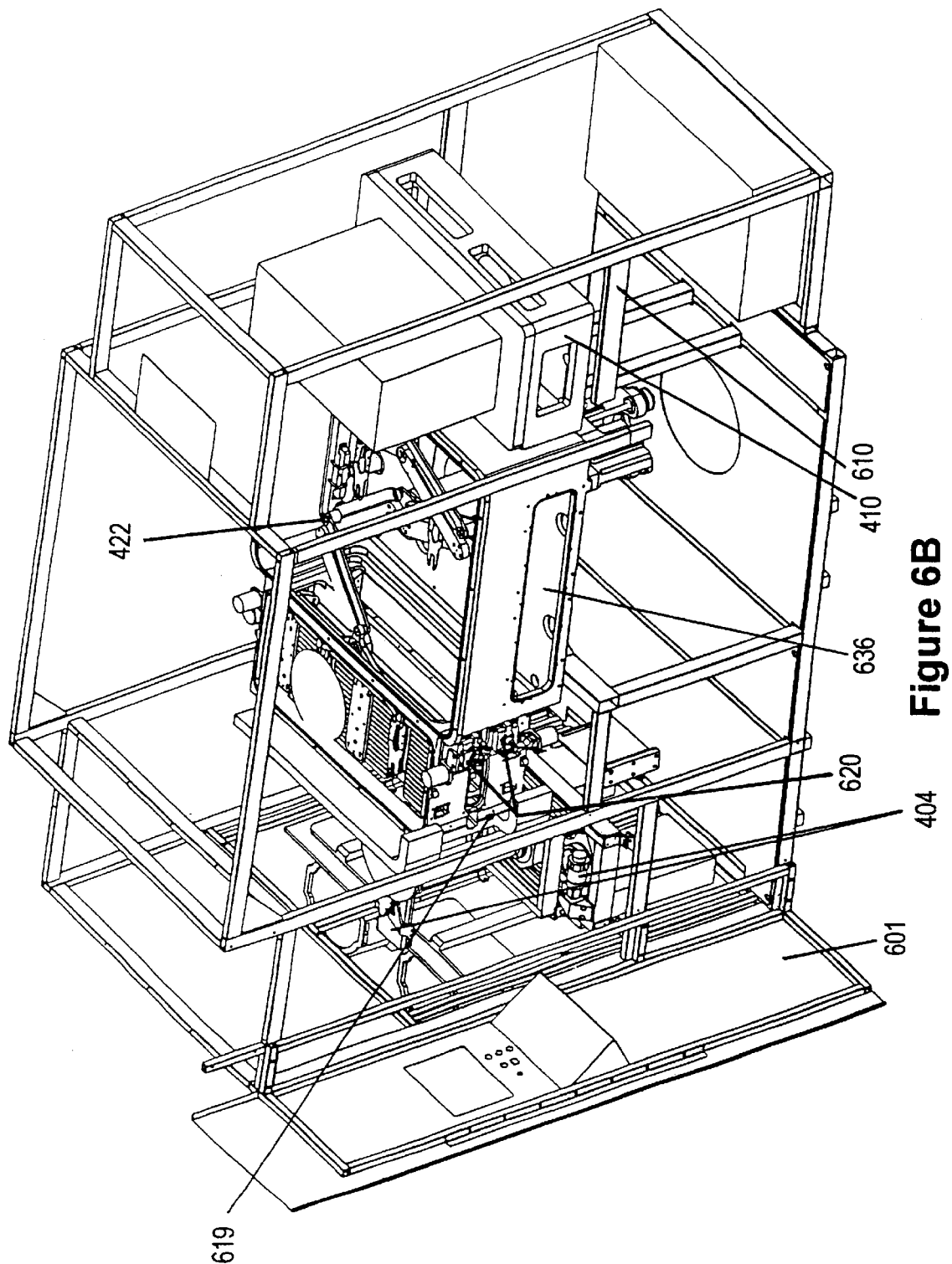
FIG. 6B is a top, rear perspective view of a workpiece handling system according to an exemplary embodiment of the present invention.

FIG. 6A is a top front perspective view and FIG. 6B is a top back perspective view of a workpiece handling system according to an embodiment of the present invention which illustrate portions of a frame structure which may be used to support and expand the workpiece handling system. As shown in FIGS. 6A and 6B cassette holders 402 and 502 are part of a cassette auto loader system 602. An operator interface panel 601 is provided adjacent to the auto loader system 602 and another may be positioned on the main frame assembly 608. The operator interface panel 601 allows an operator to program the system and adjust operational parameters. It will be understood that the various robots, doors and other mechanisms may be controlled by programmable software executed by a processing unit. Accordingly, the particular order and process steps used to manipulate workpieces may be modified for a particular application using software controls. For instance, it may be desirable in some embodiments to have the upper paddles 426a and 526a handle processed workpieces, so a robot arm does not pass over the workpieces after processing which could expose the underlying workpieces to shed particles. In such an embodiment, the software would cause the lower arm 430b to be used for new workpieces prior to processing. It will be readily apparent that any variety of process steps and sequences may be implemented by modifying the software controlling the robots, doors and other mechanisms.

In the embodiment shown in FIGS. 6A and 6B a mini-environment 604 with a Hepa or Ulpa filter may positioned between the auto loader system 602 and the load locks 406a and 406b for atmospheric robot 404. The track 505 for the atmospheric robot is also thereby contained in the mini-environment.

As shown in FIG. 6A, linear door 418a is raised to expose slit 618a to access upper load lock 406a and linear door 418b is lowered to expose slit 618b to access lower load lock 406b. Although both doors are open in FIG. 6A for purposes of illustration, normally only one door would be open at a time as described above. The linear doors are aligned on rail 619 as shown in FIG. 6B which allows the doors to be raised and lowered. The linear doors are attached to load lock frame 606.

Upper rotational door 420a is also shown in the open position in FIG. 6A for illustrative purposes, although as described above normally doors 420a and 418a would not be open at the same time. The rotational drive mechanism for opening the rotational doors is positioned adjacent to load lock frame 606 as shown at position 620 in FIGS. 6A and 6B. As will be described further below, the rotational drive mechanism moves the rotational door 420a linearly slightly back from the doorway prior to rotation. Rotational door 420a is then rotated up (or down) to open it. When it is closed, it is rotated down (or up) and then moved linearly slightly forward to seal the opening. Lower rotational door 420b uses a similar motion, although it is rotated down (or up) when it is open. While the drive mechanisms and motions for these doors is more complex than for the linear doors, they allow for two very compact doors to be used one above the other for the two load locks.

Main frame assembly 608 provides a support for transport chamber 408. Transport robot 422 is shown in FIGS. 6A and 6B with upper arm 430a extended into upper load lock 406a. Lower arm 430b is retracted.

The transport chamber shown in FIGS. 6A and 6B supports multiple process chambers through multiple docks. Process chamber 410 is connected to one of the docks and is supported by process module frame 610. Additional docks are shown at 635 (in FIG. 6A) and 636 (in FIG. 6B). An additional process chamber may be connected to each dock 635 and 636. As shown in FIG. 6A, each dock may be provided with slit door 634. With additional process chambers attached to docks 635 and 636, as many as six workpieces may be processed at a time. When process chambers are connected to docks 635 and 636, a similar process to that described above is used to load and unload workpieces, but the robot is programmed to rotate only 90 degrees when aligning with the additional process chambers. The processing may be staggered, so vacuum transport robot 422 can remove and load workpieces in each process chamber without delaying processing in the other chambers.

For instance, the robot may first rotate to align with a process chamber at dock 635 and then remove two processed workpieces and load two new workpieces. The robot then rotates 90 degrees back to the load locks to deposit the processed workpieces and retrieve two new workpieces. The robot may then rotate 180 degrees to process chamber 410, remove two processed workpieces and load the new workpieces. The robot then rotates 180 degrees back to the load locks to deposit the processed workpieces and retrieve two new workpieces. The robot then rotates 90 degrees to align with a process chamber at dock 636, remove two processed workpieces and load the new workpieces. The robot then rotates 90 degrees back to the load locks to deposit the processed workpieces and retrieve two new workpieces. The process then continues back to the process chamber at dock 635. With such a configuration, a very high throughput may be achieved.

In addition, if the process chambers at each dock were different, the robot might be programmed to move workpieces from one process chamber to another process chamber. For instance, it may be desired to process new workpieces in a process chamber at dock 635 and then move the processed workpieces from dock 635 to a second process in process chamber 410. In such an embodiment, the robot would retrieve workpieces from dock 635 and rotate 90 degrees to process chamber 410 rather than returning to the load locks. Workpieces from process chamber 410 may be removed and the workpieces from dock 635 may be deposited using the under/over transport robot arms 430a and 430b as described above. The robot could then move the workpieces from process chamber 410 back to the load lock, or in some embodiments, the workpieces may be moved to dock 636 for further processing. Through programmable software control any variety of processes may be supported with high throughput.

Figure 7A:
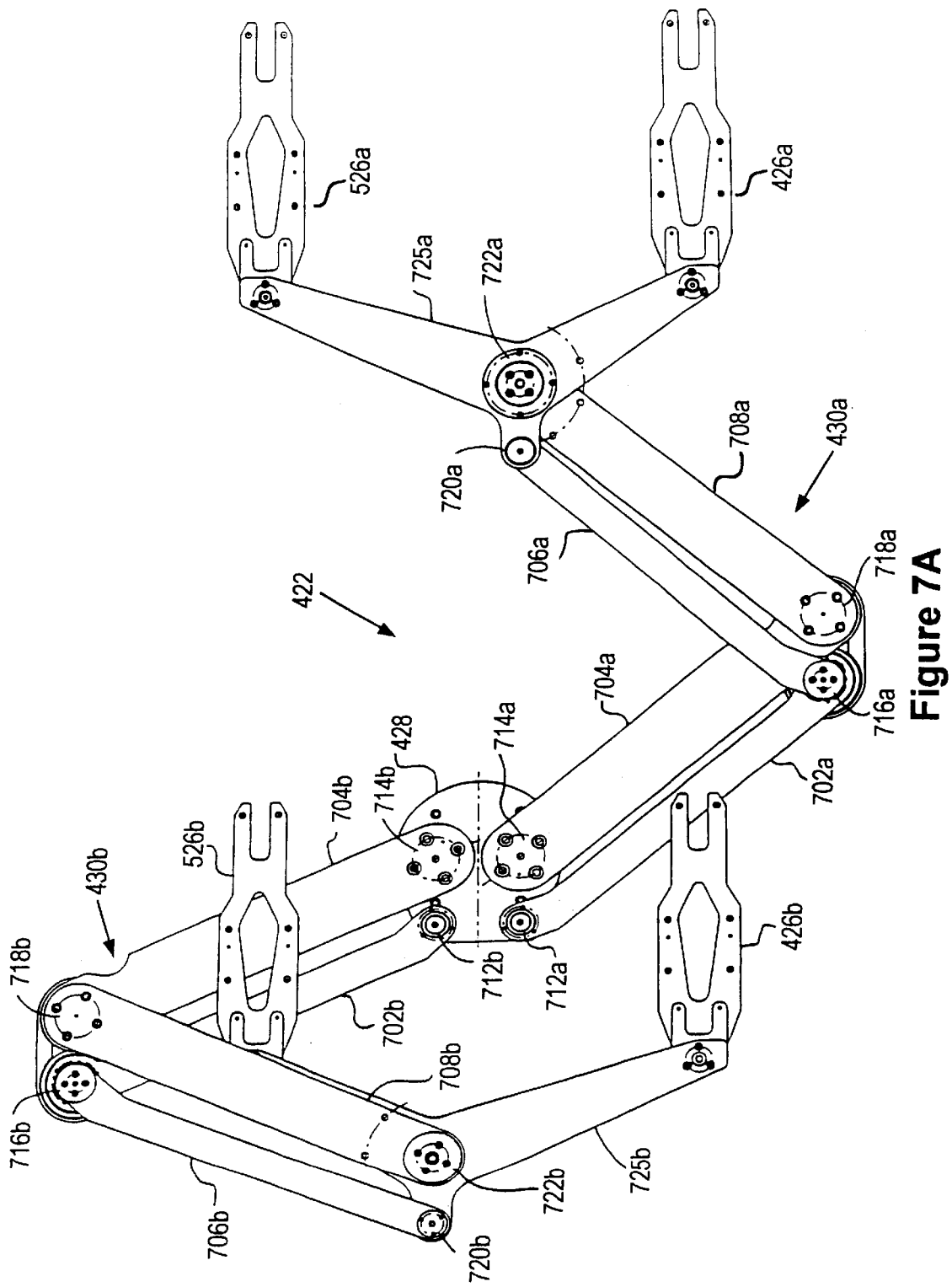
FIG. 7A is a top plan view of a vacuum transfer robot according to an exemplary embodiment of the present invention.
Figure 7B:
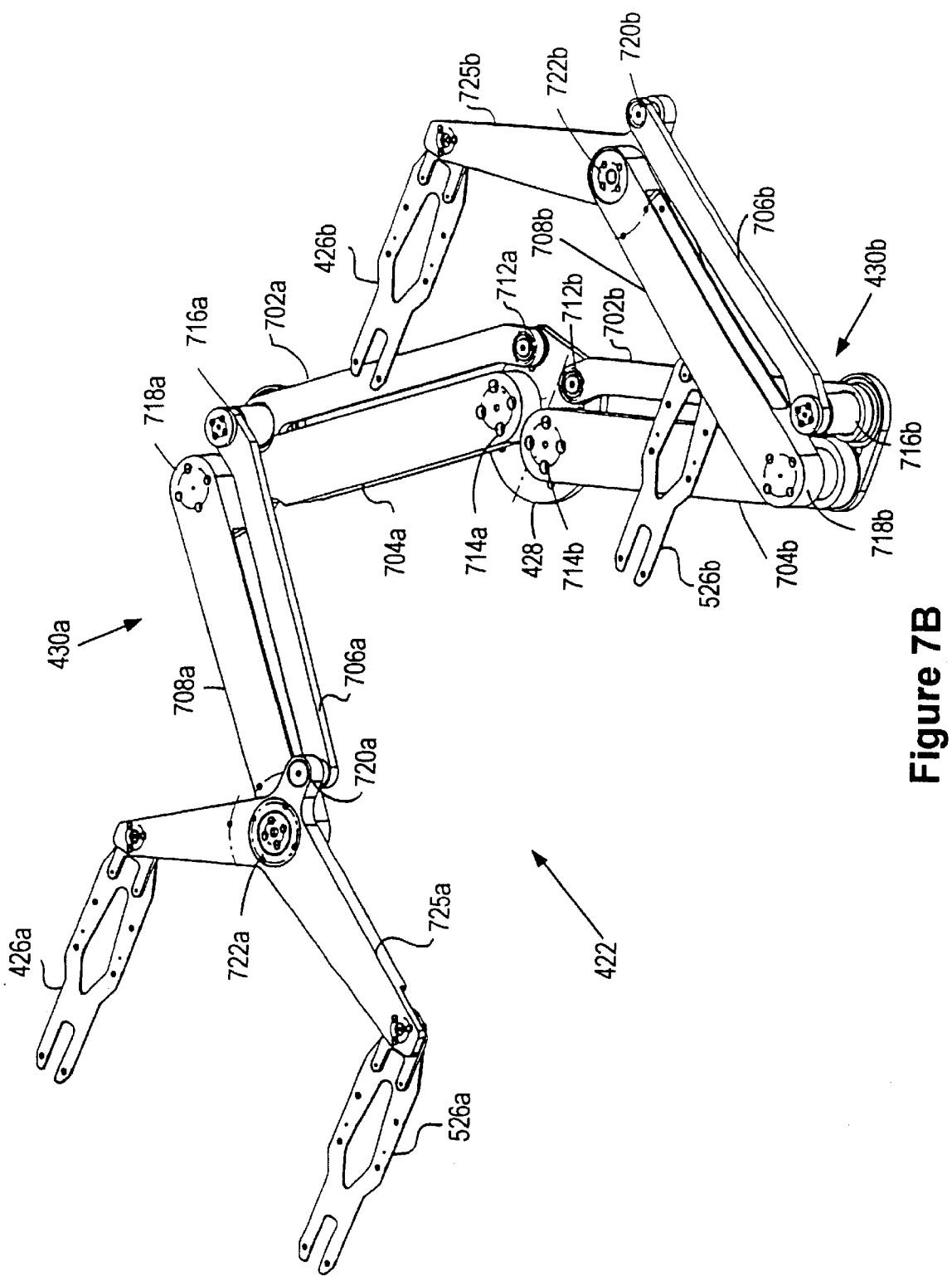
FIG. 7B is a top, rear perspective view of a vacuum transfer robot according to an exemplary embodiment of the present invention.

FIG. 7A is a top plan view, and FIG. 7B is a top, rear perspective view, of a vacuum transfer robot according to an exemplary embodiment of the present invention. The robot is shown with upper arm 430a extended and lower arm 430b retracted. As shown in FIGS. 7A and 7B, upper arm 430a has four bars connected by rotational joints. Thin base bar 702a is connected to shaft 428 by rotational joint 712a. The other end of thin base bar 702a is connected to rotational joint 716a. A wide base bar 704a is adjacent on the inside of thin base bar 702a and is connected to shaft 428 by rotational joint 714a. The other end of the wide base bar 704a is connected to rotational joint 718a. Thin fore bar 706a is connected to rotational joint 716a and extends to a split support 725a which supports paddles 426a and 526a. Thin fore bar 706a is connected to split support 725a at rotational joint 720a. A wide fore bar 708a is adjacent on the outside of thin fore bar 706a and is connected to rotational joint 718a. The wide fore bar 708a connects to the split support at rotational joint 722a.

A driving shaft may be directly coupled to wide base bar 704a through rotational joint 714a. Rotation of the shaft results in an equal rotation of wide base bar 704a. An opposite rotational movement is transmitted through wide base bar 704a into thin fore bar 706a by counter rotating elements hard-coupled to each through rotational joints 718a and 716a respectively. Both thin base bar 702a and wide fore bar 708a follow the rotation of wide base bar 704a and thin fore bar 706a, respectively. Hence, a purely linear motion is provided to the split support 725a. The arrangement of the bars ensures that the center of the split support stays aligned so the paddles move linearly when they extend or retract.

Arm 430b has a similar structure. The corresponding parts are labeled with the same number as used to describe arm 430a except that a suffix of "b" has been used instead of "a". It will be noted, however, that split support 725a is mounted above bars 706a and 708a while split support 725b is mounted below bars 706b and 708b. It will also be noted that bars 706a and 708a are mounted above rotational joints 718a and 716a which provides a clearance for the lower split support 725b to pass under upper arm 430a. This structure allows the arm to use an over/under motion to deposit and retrieve workpieces. This structure also allows arm 430b to be extended and retracted without passing paddles 426b and 526b directly under any of the rotational joints of upper arm 430a. This helps minimize the potential of shed particles from the rotational joints from dropping onto workpieces supported by paddles 426b and 526b.

The operation of rotational doors 420a and 420b will now be described with reference to FIGS. 8A–8D. FIG. 8A is a top view of rotational door 420a in the closed position and portions of rotational drive mechanism 620. The arrows indicate that a linear motion and a rotational motion may be imparted on rotational door 420a by rotational drive mechanism 620. FIG. 8B is a side cross-section of load locks 406a and 406b showing rotational doors 420a and 420b in the closed position. The rotational drive mechanism has pushed the doors against inner walls 424a and 424b to seal the doors closed. An o-ring or other mechanism may be provided at the interface of the doors and inner walls to provide a seal. FIG. 8C illustrates rotational doors 420a and 420b in the open position. As indicated by the arrows, rotational drive mechanism 620 moves the doors linearly slightly away from inner walls 424a and 424b and then rotates rotational door 420a up and rotational door 420b down to open the doors. FIG. 8D is a side cross-sectional view further illustrating the motions which may be imparted on rotational door 420a. As shown in FIG. 8D, when the rotational door 420a is rotated to the closed position it may still be a short distance from wall 424a. Rotational drive mechanism 620 can then move the door linearly toward wall 424a to seal the door.

The advantage of having such rotational doors 420a and 420b within the load locks comes from the fact that the load lock pressure is often greater than that in the transfer chamber (during workpiece loading/unloading to atmosphere) but never significantly less than it. Therefore, this rotational door is held shut by the pressure differential when the workpieces are being loaded or unloaded from that load lock. This insures that the pressure seal is well made and that the mechanism which translates the rotating door does not bear a heavy load. Further, the door mechanism is housed within the load lock and does not allow particles to fall directly into the workpiece transfer chamber or onto the load lock chamber below.

Figure 9A:
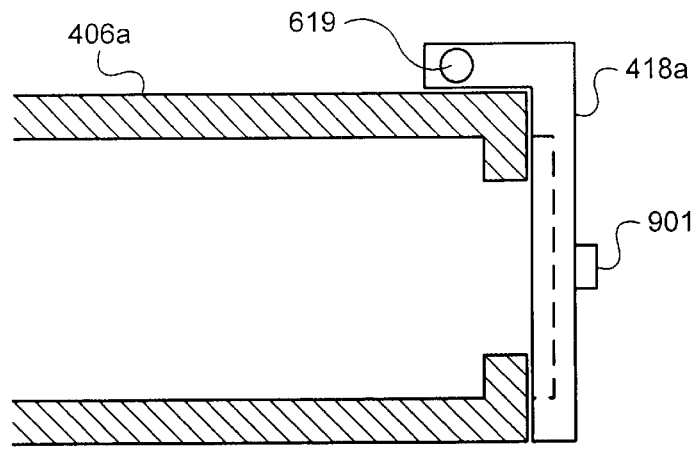
FIG. 9A is a top plan view of a linear door assembly according to an exemplary embodiment of the present invention.

The motion of linear doors 418a and 418b are also shown in FIGS. 8B and 8C. The linear doors will now be further described in conjunction with FIGS. 9A–9D. FIG. 9A is a top cross-sectional view of upper load lock 406a and a top view of linear door 418a. Linear door 418a is mounted on a linear motion track or rail 619 along which the door is guided when it is moved into open or closed position. FIG. 9D is a side view of upper load lock 406a and linear door 418a which shows rail 619. Linear door 418a further may include sensor 901 to sense the presence or absence of workpieces. When a workpiece is sensed, a signal is provided by the sensor 901 to a mechanism for sliding linear door 418a upward along rail 619 to a position that allows workpieces to pass through the doorway of upper load lock 406a. The motion of the door in the embodiment shown in FIG. 9D is accomplished by a pneumatic cylinder but it will be appreciated that many alternatives, such as linear bearings, lead screws, and motors also may be employed to move linear door 418a.

Figure 9B:
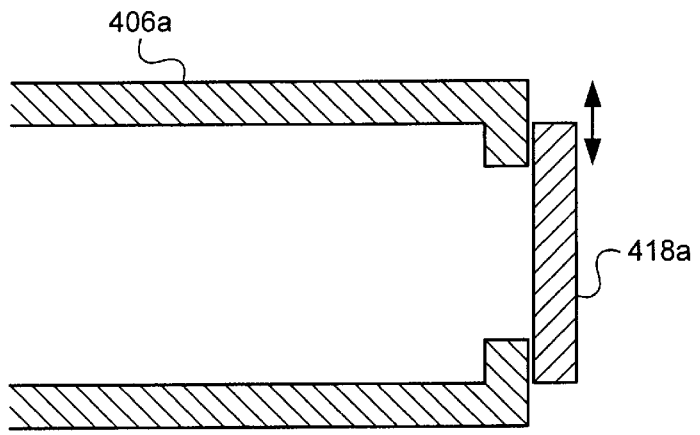
FIG. 9B is a simplified side view of a linear door assembly according to an exemplary embodiment of the present invention.
Figure 9C:
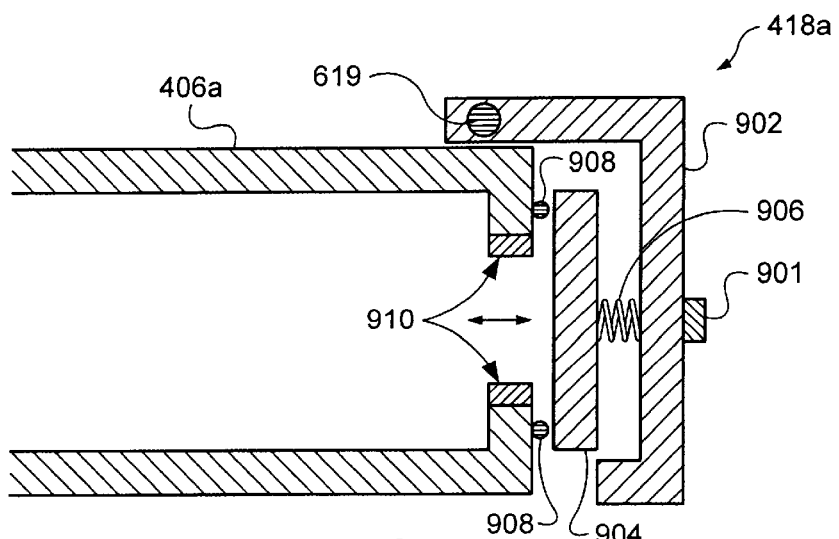
FIG. 9C is a top cross-sectional view of a linear door assembly according to an exemplary embodiment of the present invention.
Figure 9D:
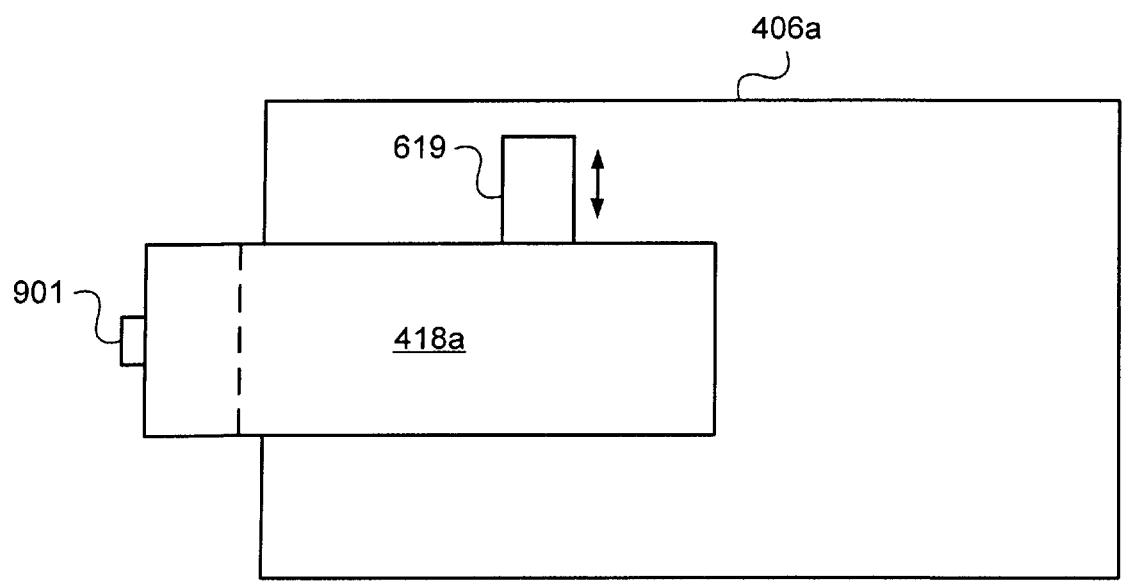
FIG. 9D is a side view of a linear door assembly according to an exemplary embodiment of the present invention.

FIG. 9B is a side cross-section of upper load lock 406a and linear door 418a with arrows indicating the directions in which linear door 418a may be moved. FIG. 9C is a top cross-section of upper load lock 406a and linear door 418a which shows the mechanism used to seal the door when it is closed. As shown in FIG. 9C, linear door 418a includes door frame 902 which forms a recess. A door plate 904 is positioned in the recess and is connected to the door frame 902 by an extendable connector, such as spring 906. When door frame 902 is lowered over the doorway, door plate 904 may be extended to seal the door. When vacuum processing pressures are used, the pressure differential may then cause door plate 904 to seal the doorway. O-rings 908 or other mechanisms may be used to provide a good seal. Electromagnets 910 may also be used to attract door plate 904 and seal the doorway. In such embodiments, door plate 904 could comprise a magnetic material capable of being attracted to electromagnets 910 or such material could be mounted to door plate 904, if it is non-magnetic, for the same result. Such magnets could be mounted outside the o-ring seal such that they are not in vacuum when the load lock is evacuated.

When workpieces have been loaded into the load lock and it is desired to seal upper load lock 406a, the linear door 428a, which is positioned above the doorway, is lowered to cover the doorway. Electromagnets 910 are activated and door plate 904 extends toward the electromagnets to form a seal against o-rings 908. When it is desired to transfer workpieces out of upper load lock 406a, upper load lock 406a is re-pressurized to equalize with the pressure of the surrounding environment. If electromagnets 910 are being used, they are deactivated or made to provide a repelling force. Spring 906 or other extension device in conjunction with the repulsive electromagnetic force then retracts door plate 904 to unseal the doorway. Linear door 418a is then raised along rail 619 to open the doorway and allow workpieces to be removed from upper load lock 406a. It will be understood that a similar mechanism is used for lower linear door 418b except that the door is lowered when it is opened.

Figure 10A:
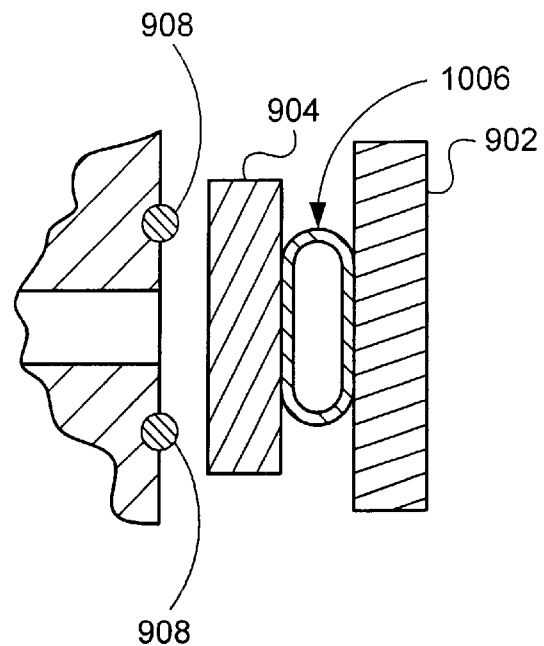
FIG. 10A is a side cross-sectional view of a linear door assembly according to an alternate embodiment of the present invention.
Figure 10B:
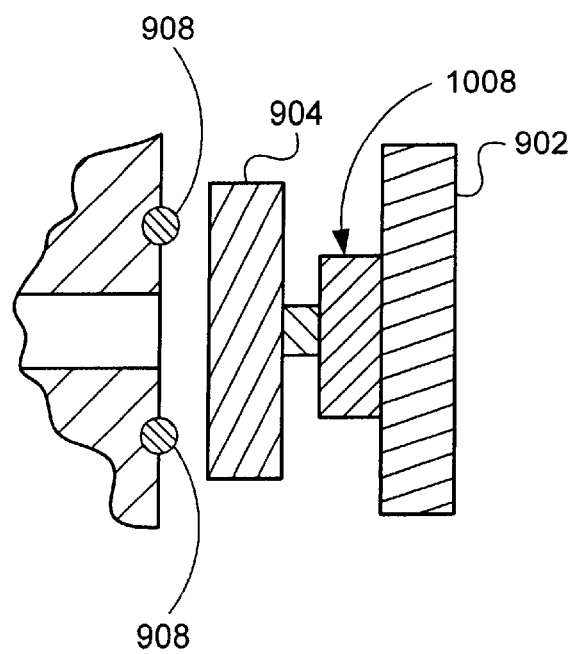
FIG. 10B is a side cross-sectional view of a linear door assembly according to an alternate embodiment of the present invention.

Many alternatives to the embodiment shown in FIGS. 9A–9D are possible. For example, instead of an electromagnet, other devices may be employed to extend door plate 904 to seal the doorway. As shown in FIG. 10A, inflatable tube 1006 may be inflated to push door plate 904 against the doorway. The inflatable tube 1006 is deflated to unseal and open the door. As shown in FIG. 10B, a pneumatic cylinder 1008 may also be used to push door plate 904 against, and retract door plate 904 from, the doorway. The ease with which door plate 904 may be extended and retracted allows the door to function as an over-pressure valve and a "back to atmosphere" switch.

Figure 11:
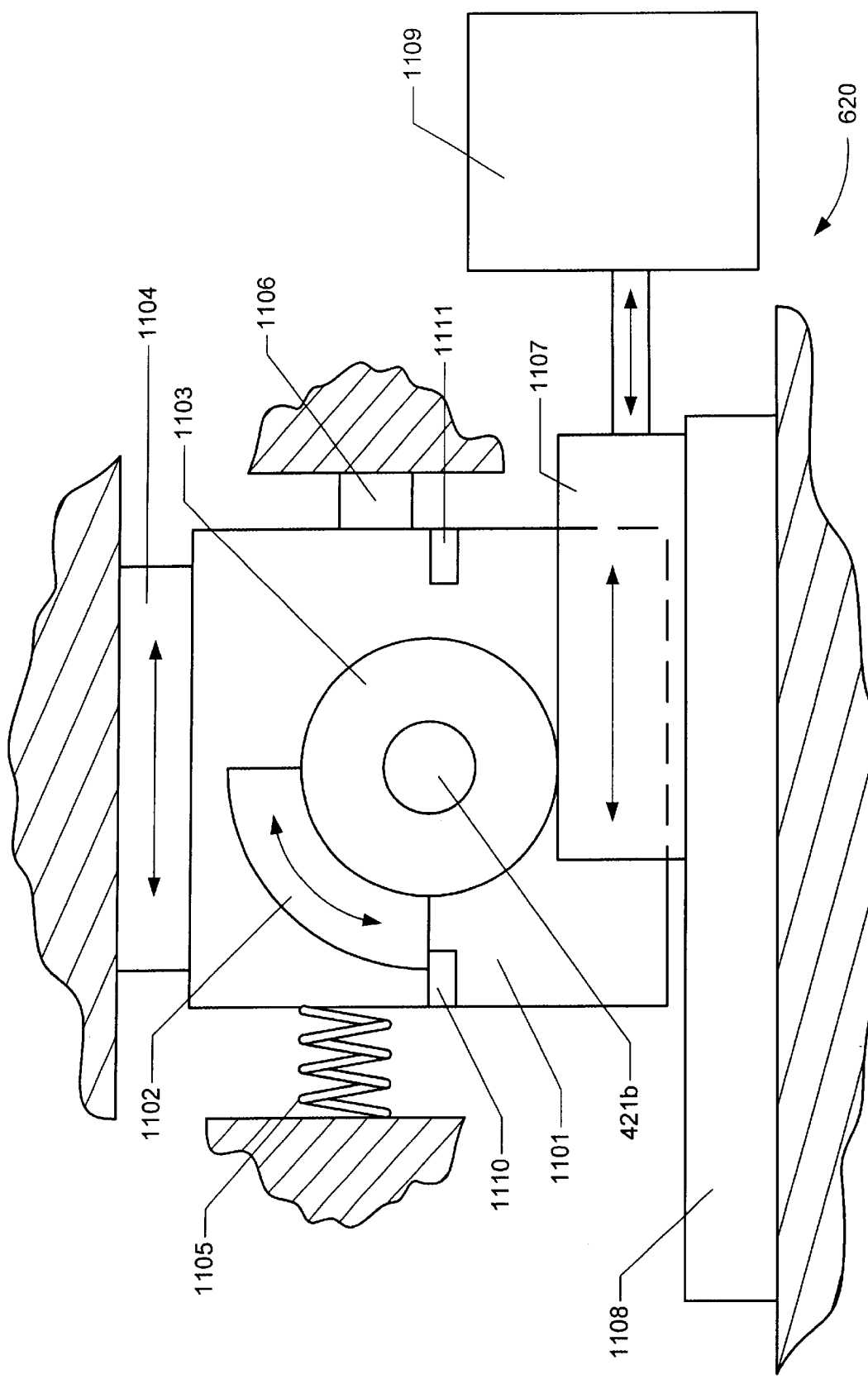
FIG. 11 illustrates a side view of a rotary mechanism.

FIG. 11 illustrates a side view of rotary mechanism 620. Rotary mechanism 620 is used to rotate and translate rotational doors 420a and 420b for opening and sealing the system. The mechanism operates on the outside of load locks 406a and 406b. The following discussion describes mechanism 620 of the lower load lock 406b. A similar discussion applies to the mechanism of upper load lock 406a. Rotational door 420b and shaft 421b are secured to slide block 1101 and allowed to rotate therein. Outside slide block 1101, rotary stop 1102 and gear 1103 are rigidly fixed to and rotate with the shaft. The slide block 1101 is allowed to translate on linear slide 1104 and is acted on by spring 1105 so that it rests against hard stop 1106. Interacting with and engaging gear 1103 is a linear rack 1107 which can translate on slide 1108 and is motivated by piston 1109. As shown, linear rack 1107 is being pulled into piston 1109 such that rotary stop 1102 is pushed against block 1110. This position of the mechanism places rotational door 420b in the orientation shown in FIG. 8C. When piston 1109 pushes on linear rack 1107, gear 1103 is rotated clockwise as are rotary top 1102 and rotational door 420b. Spring 1105 reacts against any impending translation of slide block 1101 and keeps it pushed against hard stop 1106. Once rotary top 1102 comes into contact with stop 1111, rotary motion stops. Piston 1109, However, continues to push linear rack 1107 into gear 1103. By virtue of rotational impedance, slide block 1101 is translated on linear slide 1104 into spring 1105. This motion is coupled to rotational door 420b which pushes against a sealing mechanism the doorway and isolates lower load lock 406b from vacuum transport chamber 408. In this mode, the door is considered closed. Both slide block 1101 and the shaft of rotational door 420b are sealed by means of 0-rings or other devices such as bellows to isolate lower load lock 406b from the surrounding environment.

When rotational door 420b is opened, piston 1109 retracts. In doing so, spring 1105 pushes slide block 1101 into hard stop 1106. Since there is no relative motion between linear rack 1107 and gear 1103 during this movement, pure translation is realized and rotational door 420b moves away from the doorway and its seal. Once slide block 1101 hard stops, linear rack 1107 continues to be pulled by piston 1109 and rotational motion is imparted to rotational door 420b through gear 1103. Finally, rotary stop 1102 makes contact with bock 1110 and rotation stops. Again, rotational door 420b is now in the open position.

In alternative embodiments, piston 1109 could be replaced by a motor driven lead screw or any other translational driving mechanism. Linear rack 1107 and gear 1103 could interface through friction and eliminate tooth contacts. Spring 1105 could be replaced by a piston or inflatable bladder.

Figure 12:
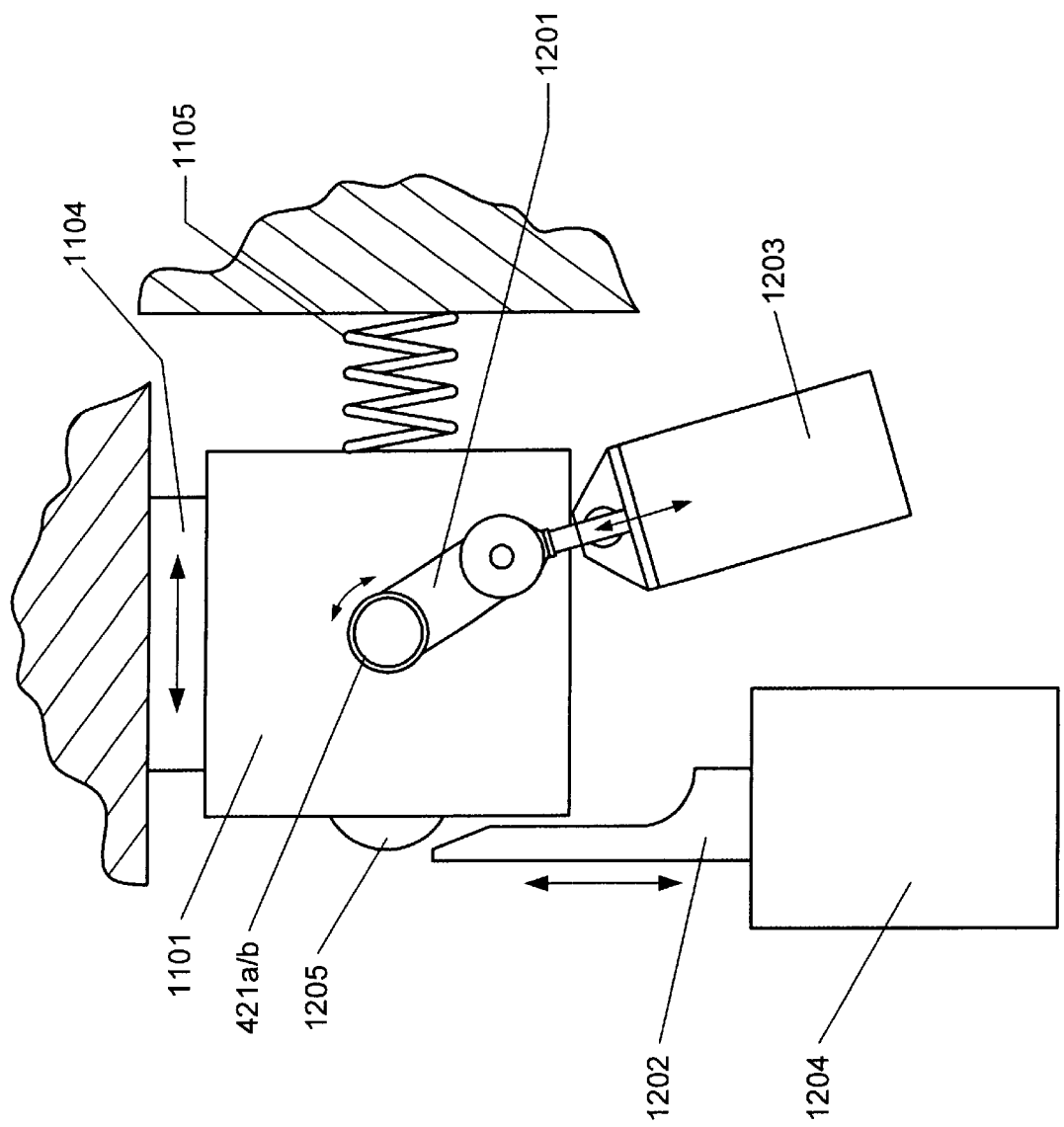
FIG. 12 illustrates an alternative embodiment of a rotary mechanism.

In another embodiment shown in FIG. 12, rotation and translation could be controlled separately by linkage 1201 and wedge 1202. Sensors on control pistons 1203 and 1204 could indicate the position of the rotary door and coordinate the motions. To close, piston 1203 would extend and rotate linkage 1201 counter clockwise which is attached to rotational door 420a or 420b and is contained in slide block 1101. Once proper position was achieved, which could be through the use of a hard stop, control piston 1204 would extend pushing wedge 1202 into roller 1205.

Since roller 1205 is fixed to slide block 1101, translation and sealing of rotational door 420a or 420b to their respective doorways is achieved. To open, control piston 1204 is retracted and spring 1105 pushes back on slide block 1101. Once in proper horizontal position, piston 1203 retracts and rotates rotational door 420a or 420b to an open position.

The foregoing description is presented to enable any person skilled in the art to make and use the invention. Descriptions of specific designs are provided only as examples. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

We claim:

1. A door system for sealing a doorway between two chambers in a workpiece processing system, the door system comprising:

a door sized to seal the doorway;

means for moving the door against the doorway to seal the doorway;

means for retracting the door from the doorway to unseal the doorway; and means for rotating the door in a vertical direction around an axis substantially parallel to the orientation of the doorway such that workpieces may pass through the doorway, wherein the means for rotating the door comprises:

a shaft coupled to the door;

a rotation gear coupled to the shaft; and a linear gear operatively engaged with the rotation gear such that linear motion of the linear gear relative to the rotation gear causes rotation of the rotational gear.

2. The door system of claim 1, wherein the means for moving comprises:

a housing configured to support the shaft via an aperture formed through the housing and to slidedly move in a linear direction toward the doorway and away from the doorway;

a rotary stop block coupled to the housing; and a rotary stop coupled to the shaft, the rotary stop configured to stop rotation of the shaft in response to the rotary stop impinging the rotary stop block, whereby further linear motion of the linear gear relative to the rotation gear causes the housing to move in a linear direction toward the doorway.

3. The door system of claim 1, wherein the means for retracting comprises:

a housing configured to support the shaft via an aperture formed through the housing and to slidedly move in a linear direction toward the doorway and away from the doorway; and a spring configured to apply a force to the housing to slidedly move the housing in a linear direction away from the doorway.

4. A door system for sealing a doorway between two chambers in a workpiece processing system, the door system comprising:

a door sized to seal the doorway;

means for moving the door against the doorway to seal the doorway;

means for retracting the door from the doorway to unseal the doorway; and means for rotating the door in a vertical direction around an axis substantially parallel to the orientation of the doorway such that workpieces may pass through the doorway, wherein the means for rotating comprises:

a shaft coupled to the door;

a linkage member coupled to the shaft; and a piston coupled to the linkage such that actuation of the piston causes rotation of the shaft.

5. The door system of claim 4, wherein the means for moving comprises a wedge member configured to move the shaft in a linear direction toward the doorway in response to actuation of the wedge member.

6. A door system for sealing a doorway between two chambers in a workpiece processing system, the door system comprising:

a door sized to seal the doorway, the door having an open position that allows workpieces to pass through the doorway and a sealing position that orients the door to seal the doorway;

a housing having an open position rotation stop and a sealing position rotation stop;

a shaft coupled to the door and rotationally coupled to the housing;

a rotation gear coupled to the shaft wherein the rotation gear includes a rotary stop which contacts the open position rotation stop when the door is in the open position and which contacts the sealing position rotation stop when the door is in the sealing position;

a linear gear operatively engaged with the rotation gear such that linear motion of the linear gear relative to the rotation gear causes rotation of the door in a vertical direction between the open position and the sealed position.

7. The door system of claim 6, further comprising a spring coupled to the housing wherein the spring pushes the housing in a direction substantially parallel to the direction of linear motion of the linear gear.

8. The door system of claim 6, wherein the housing is configured to slidedly move between a first position and a second position in response to movement of the linear gear, the first position compressing the door against the doorway when the door is in the sealing position and the second position providing a space between the door and the doorway when the door is not in the sealing position.

9. The door system of claim 6, wherein the linear gear is coupled to a piston to provide the linear motion.

10. The door system of claim 6, wherein the linear gear is coupled to a lead screw to provide the linear motion.

11. The door system of claim 6, further comprising a sealing member coupled to a peripheral portion of the doorway to seal the doorway when the door is in the sealing position.

12. A door system for sealing a doorway between a first chamber and a second chamber, the door system comprising:

a door having an area larger than the doorway;

a shaft coupled to the door, the shaft configured to rotate the door in a vertical direction between an open position that allows workpieces to pass through the doorway and a closed position that orients the door to seal the doorway; and a rotable drive, coupled to the shaft, configured to rotatably actuate the shaft to rotate the door between the open position and the closed position and to linearly translate the door between a sealed position and an unsealed position, the sealed position compressing the door against the doorway when the door is in a closed position and the unsealed position allowing the door to move between the closed position and the open position.

13. The door system of claim 12, wherein the rotable drive comprises:

a rotation gear coupled to the shaft; and a linear gear operatively engaged with the rotation gear such that linear motion of the linear gear relative to the rotation gear causes rotation of the rotation gear and the door between the open position and the sealed position.

14. The door system of claim 13, wherein the rotable drive further comprises a housing for supporting the shaft, the housing configured to slidedly move the shaft between the sealed position and the unsealed position in response to actuation of the linear gear.

15. The door system of claim 13, wherein the rotation gear includes a rotary stop which contacts an open position rotation stop when the door is in the open position and which contacts a sealing position rotation stop when the door is in the sealing position.

16. The door system of claim 12, wherein the rotable drive comprises:

a linkage coupled to the shaft;

a piston coupled to the linkage such that actuation of the piston causes rotation of the door between the open position and the closed position; and a wedge member configured to linearly translate the rotable drive to move door between the sealed position and the unsealed position in response to actuation of the wedge member.

17. The door system of claim 16, further comprising sensors for sensing a position of the door and coordinating actuation of the piston and the wedge member such that the door is moved to the unsealed position before the door is moved between the open position and the closed position.

18. The door system of claim 16, wherein the rotable drive further comprises a housing for supporting the shaft, the housing configured to slidedly move the shaft between the sealed position and the unsealed position in response to actuation of the wedge member.

* * * * *